United States Patent
Teeter et al.

(10) Patent No.: US 11,547,011 B2
(45) Date of Patent: Jan. 3, 2023

(54) DIRECT DATA BUS BETWEEN MODULAR DEVICES

(71) Applicant: DELL PRODUCTS L.P., Round Rock, TX (US)

(72) Inventors: Victor Teeter, Round Rock, TX (US); Shree Rathinasamy, Round Rock, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 248 days.

(21) Appl. No.: 16/924,152

(22) Filed: Jul. 8, 2020

(65) Prior Publication Data

US 2022/0015255 A1 Jan. 13, 2022

(51) Int. Cl.
G06F 1/16 (2006.01)
H05K 5/00 (2006.01)
H05K 7/00 (2006.01)
H05K 7/14 (2006.01)
H05K 5/02 (2006.01)

(52) U.S. Cl.
CPC ......... H05K 7/1472 (2013.01); G06F 1/1656 (2013.01); H05K 5/0221 (2013.01); H05K 5/0256 (2013.01); H05K 7/1428 (2013.01); H05K 7/1475 (2013.01)

(58) Field of Classification Search
CPC .. H05K 7/1472; H05K 7/1428; H05K 7/1475; H05K 7/1477; H05K 7/1478; H05K 7/1427; H05K 5/0221; H05K 5/0256; H05K 5/0226; H05K 5/0286; G06F 1/1656
See application file for complete search history.

(56) References Cited

U.S. PATENT DOCUMENTS

| | | | | |
|---|---|---|---|---|
| 9,089,067 | B2* | 7/2015 | Gaub | H05K 7/1478 |
| 10,042,396 | B1* | 8/2018 | Gupta | G05B 19/0421 |
| 10,128,612 | B1* | 11/2018 | Casto | H01R 13/52 |
| 2003/0099094 | A1* | 5/2003 | Coles | H05K 7/1409 |
| | | | | 361/679.33 |
| 2004/0171312 | A1* | 9/2004 | Sichner | H05K 7/1478 |
| | | | | 439/701 |
| 2010/0067196 | A1* | 3/2010 | Costello | H05K 7/20509 |
| | | | | 361/709 |
| 2011/0286187 | A1* | 11/2011 | McLean | H05K 5/0221 |
| | | | | 361/747 |
| 2012/0115345 | A1* | 5/2012 | Mulfinger | H05K 7/1457 |
| | | | | 439/296 |
| 2013/0094811 | A1* | 4/2013 | Rossman | H01R 13/6275 |
| | | | | 385/75 |
| 2015/0156902 | A1* | 6/2015 | Terwilliger | H05K 7/1487 |
| | | | | 403/321 |
| 2015/0214657 | A1* | 7/2015 | Geitner | H05K 7/1478 |
| | | | | 439/357 |
| 2018/0145485 | A1* | 5/2018 | Fischer | H05K 7/1478 |

* cited by examiner

*Primary Examiner* — Anthony M Haughton
(74) *Attorney, Agent, or Firm* — North Weber & Baugh LLP

(57) ABSTRACT

Systems and methods for establishing a direct communication between modular electronic devices comprise a connector assembly implemented in a first modular device and having a connector that is implemented in a housing. The housing holding the connector may use a spring to mate with a receptacle of a second modular device, e.g., a module in a chassis in a data center, to establish a releasable direct connection without utilizing a backplane.

20 Claims, 12 Drawing Sheets

*500*

_700_

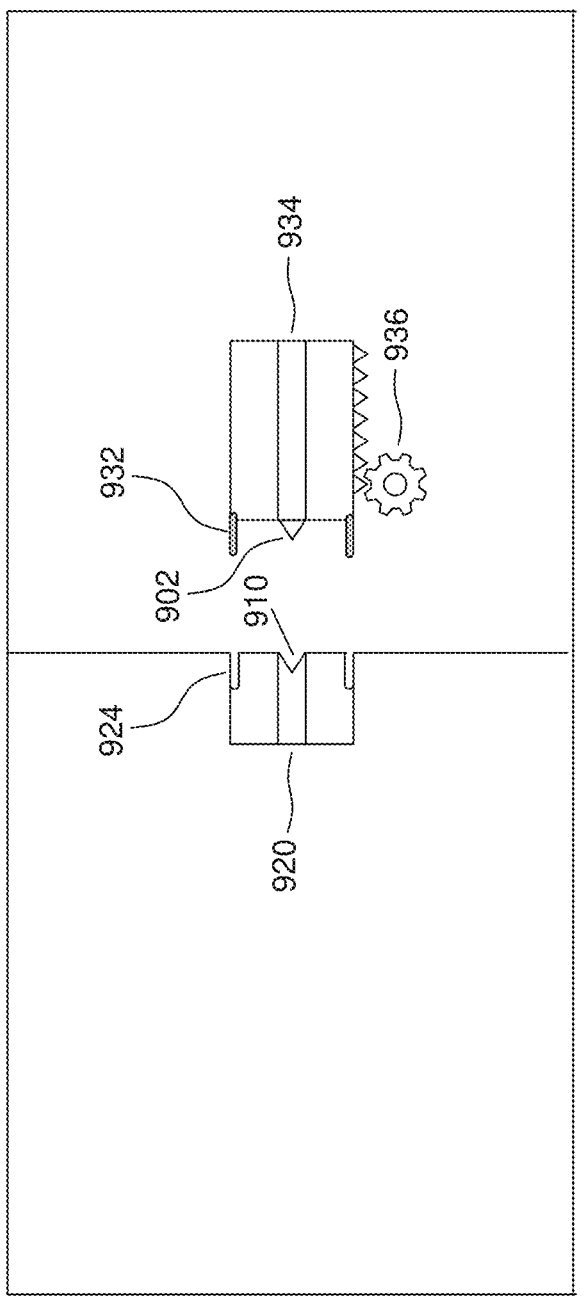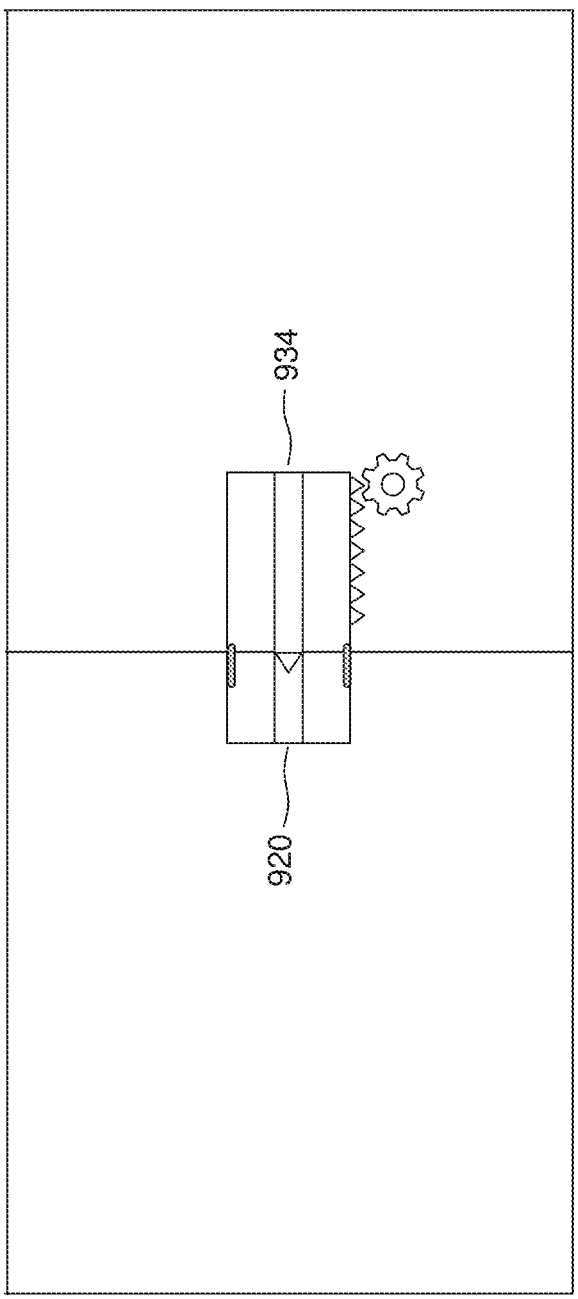

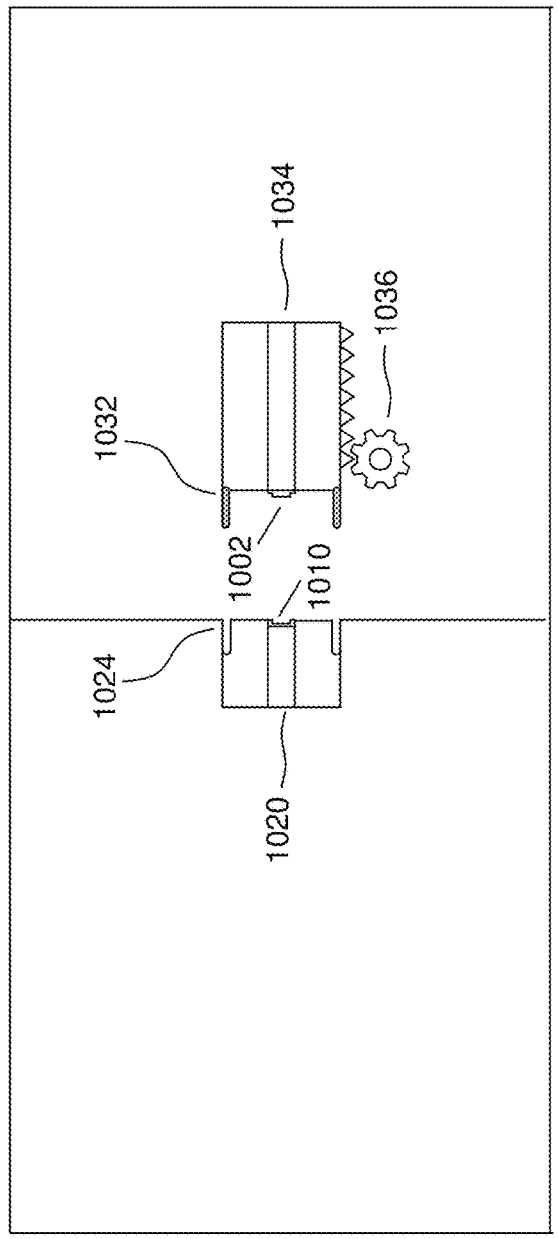
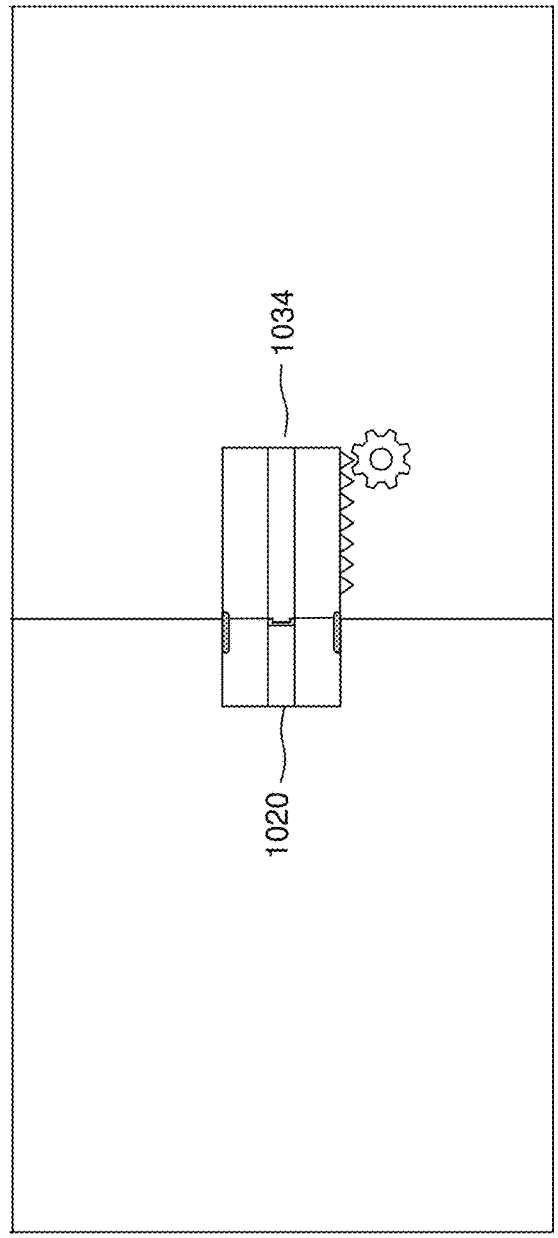

1100

```
┌─────────────────────────────────────────────────┐
│ IN RESPONSE TO A FIRST MODULE THAT COMPRISES A  │
│ CONNECTOR ASSEMBLY BEING MOVED ALONG AN         │
│ ENCLOSURE OF A SECOND MODULE, CAUSE THE         │
│ CONNECTOR ASSEMBLY TO AT LEAST PARTIALLY        │─ 1105
│ RETRACT INWARDLY INTO THE FIRST MODULE, THE     │
│ ENCLOSURE COMPRISING A RECEPTACLE ASSEMBLY,     │
│ THE CONNECTOR ASSEMBLY COMPRISING A             │
│ CONNECTOR AND A CONNECTOR MATING INTERFACE,     │
│ THE RECEPTACLE ASSEMBLY COMPRISING A            │
│ RECEPTACLE AND A RECEPTACLE MATING INTERFACE    │
└─────────────────────────────────────────────────┘
                          │
                          ▼
┌─────────────────────────────────────────────────┐
│ IN RESPONSE TO THE CONNECTOR ASSEMBLY AT LEAST  │
│ PARTIALLY ALIGNING WITH THE RECEPTACLE ASSEMBLY,│─ 1110
│ CAUSE THE CONNECTOR ASSEMBLY TO MOVE INTO THE   │
│ RECEPTACLE ASSEMBLY                             │
└─────────────────────────────────────────────────┘
                          │
                          ▼
┌─────────────────────────────────────────────────┐
│ IN RESPONSE TO THE CONNECTOR ASSEMBLY MOVING    │
│ INTO THE RECEPTACLE ASSEMBLY, ESTABLISH A       │
│ RELEASABLE CONNECTION BETWEEN THE CONNECTOR     │─ 1115
│ MATING INTERFACE AND A RECEPTACLE MATING        │
│ INTERFACE ALONG A MATING AXIS                   │
└─────────────────────────────────────────────────┘
```

FIG. 11

DIRECT DATA BUS BETWEEN MODULAR DEVICES

BACKGROUND

The present disclosure relates generally to information handling systems. More particularly, the present disclosure relates to communication between modular devices in data centers and similar environments.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use, such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Space constraints in conventional multi-module chassis architectures do not permit a direct connection between adjacent modules in a chassis bay once the adjacent modules have been placed into the chassis. The compact design of modular systems makes it practically impossible to access ports of a module from the rear or the sides, e.g., on a modular server that for cost reasons typically does not have any ports at its front side, to make cable connections, even if the chassis is not fully loaded. Accordingly, it would be desirable to have systems and methods that allow to overcome the accessibility problems and other shortcomings of existing modular designs, while maintaining and, ideally, increasing communication bandwidth.

BRIEF DESCRIPTION OF THE DRAWINGS

References will be made to embodiments of the disclosure, examples of which may be illustrated in the accompanying figures. These figures are intended to be illustrative, not limiting. Although the accompanying disclosure is generally described in the context of these embodiments, it should be understood that it is not intended to limit the scope of the disclosure to these particular embodiments. Items in the figures may not be to scale.

FIG. 9A and FIG. 9B depict a waveguide coupling mechanism for establishing a communication between two modules, according to embodiments of the present disclosure.

FIG. 10A and FIG. 10B depict an alternative waveguide coupling mechanism, according to embodiments of the present disclosure.

FIG. 11 depicts a flowchart for an exemplary process for establishing a communication between modular devices according to embodiments of the present disclosure.

DETAILED DESCRIPTION OF EMBODIMENTS

Figure 1:
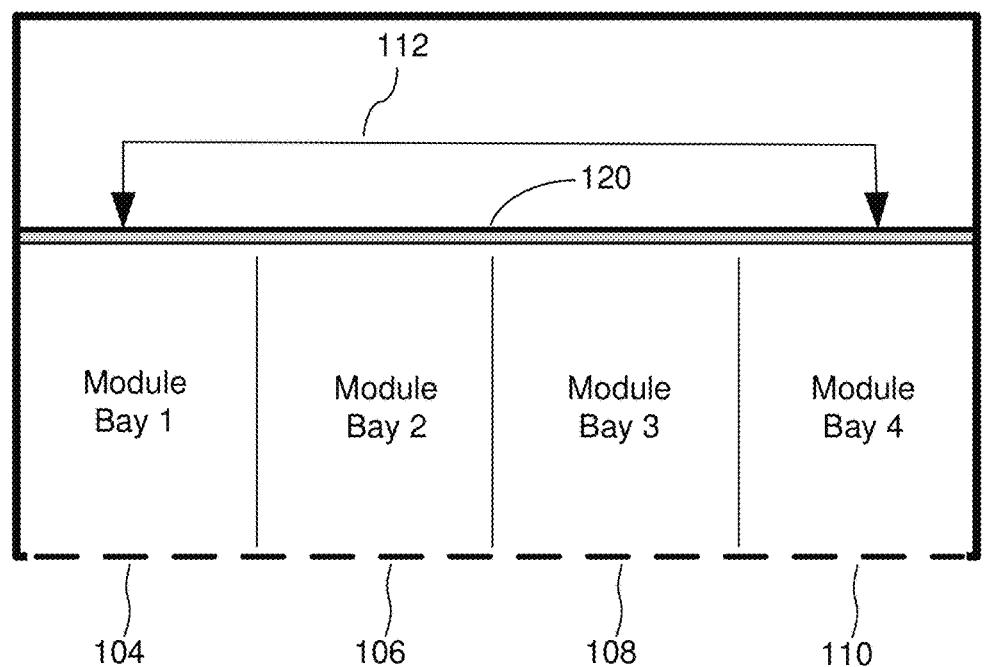
FIG. 1 depicts a chassis having four module bays that have a common communication backplane.

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways, such as a process, an apparatus, a system/device, or a method on a tangible computer-readable medium.

Components, or modules, shown in diagrams are illustrative of exemplary embodiments of the disclosure and are meant to avoid obscuring the disclosure. It shall also be understood that throughout this discussion that components may be described as separate functional units, which may comprise sub-units, but those skilled in the art will recognize that various components, or portions thereof, may be divided into separate components or may be integrated together, including, for example, being in a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," "communicatively coupled," "interfacing," "interface," or any of their derivatives shall be understood to include direct connections, indirect connections through one or more intermediary devices, and wireless connections. It shall also be noted that any communication, such as a signal, response, reply, acknowledgement, message, query, etc., may comprise one or more exchanges of information.

Reference in the specification to "one or more embodiments," "preferred embodiment," "an embodiment,"

"embodiments," or the like means that a particular feature, structure, characteristic, or function described in connection with the embodiment is included in at least one embodiment of the disclosure and may be in more than one embodiment. Also, the appearances of the above-noted phrases in various places in the specification are not necessarily all referring to the same embodiment or embodiments.

The use of certain terms in various places in the specification is for illustration and should not be construed as limiting. The terms "include," "including," "comprise," and "comprising" shall be understood to be open terms and any examples are provided by way of illustration and shall not be used to limit the scope of this disclosure.

A service, function, or resource is not limited to a single service, function, or resource; usage of these terms may refer to a grouping of related services, functions, or resources, which may be distributed or aggregated. The use of memory, database, information base, data store, tables, hardware, cache, and the like may be used herein to refer to system component or components into which information may be entered or otherwise recorded. The terms "data," "information," along with similar terms, may be replaced by other terminologies referring to a group of one or more bits, and may be used interchangeably. The words "optimal," "optimize," "optimization," and the like refer to an improvement of an outcome or a process and do not require that the specified outcome or process has achieved an "optimal" or peak state.

It shall be noted that: (1) certain steps may optionally be performed; (2) steps may not be limited to the specific order set forth herein; (3) certain steps may be performed in different orders; and (4) certain steps may be done concurrently.

Any headings used herein are for organizational purposes only and shall not be used to limit the scope of the description or the claims. Each reference/document mentioned in this patent document is incorporated by reference herein in its entirety.

It shall also be noted that although embodiments described herein may be within the context of modular devices located in a chassis, aspects of the present disclosure are not so limited. Accordingly, the aspects of the present disclosure may be applied or adapted for use in other contexts that do not involve a chassis.

In this document, the terms "bay," "module bay" may be used interchangeably. Similarly, the terms "module" and "modular device" are used interchangeably. "Connection" refers to any type of connection, including electrical, mechanical, optical, and electro-optical connection.

FIG. 1 depicts a common cassis 100 that is partitioned into four module bays 104-110 denoted as "module bay 1" through "module bay 4." Each of bay (or slot) 104-110 is designed to accommodate a removable modular device, such as an input/output module that once placed into chassis 100 may communicate (112) with one or more other devices coupled to chassis 100, e.g., over backplane 120 (or midplane), orthogonal connectors, or similar chassis technology that facilitates modular connectivity.

Figure 2:
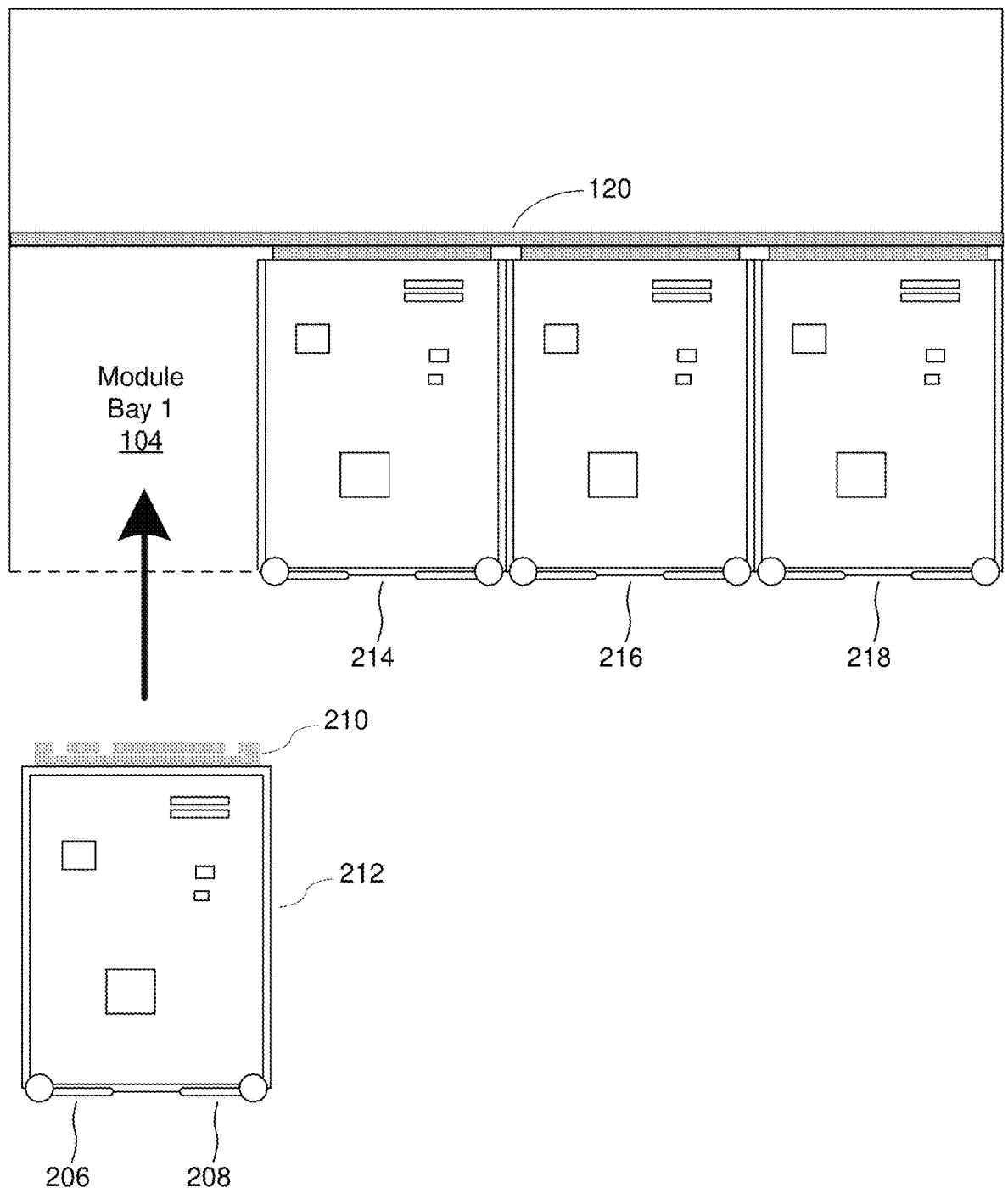
FIG. 2 depicts removable modules mounted in a chassis and communicatively coupled to a common communication backplane.

As depicted in FIG. 2, each removable module 212-218 may be inserted or mounted into a respective module bay that is designed to accommodate a module and locked in place by using opposing insertion/removal lever 206, 208, disused in greater detail below with reference to FIG. 5. Chassis 200 in FIG. 2 comprises module bays 104-110 and backplane 120. Backplane 120 is designed to provide connectivity between modules (or sleds) 212-218, e.g., network servers, network switches, Fibre channel switches, management modules, pass-thru modules, fans, power supplies, storage devices, other types of modules that can be inserted into bays 104-110. Each module (e.g., 212) contains an interface (e.g., 210) that is designed to couple to backplane 120. Interface 210 may be a bus port, an orthogonal connection that allows access to the back of chassis 200, or any other standardized interface known in the art. In operation, modules 212-218 placed into adjacent bays 104-110 may communicate with each other over common backplane 120 connection. For example, module 212 may use backplane 120 to communicate with non-adjacent module 218 using any suitable communication known the relevant art.

Figure 3:
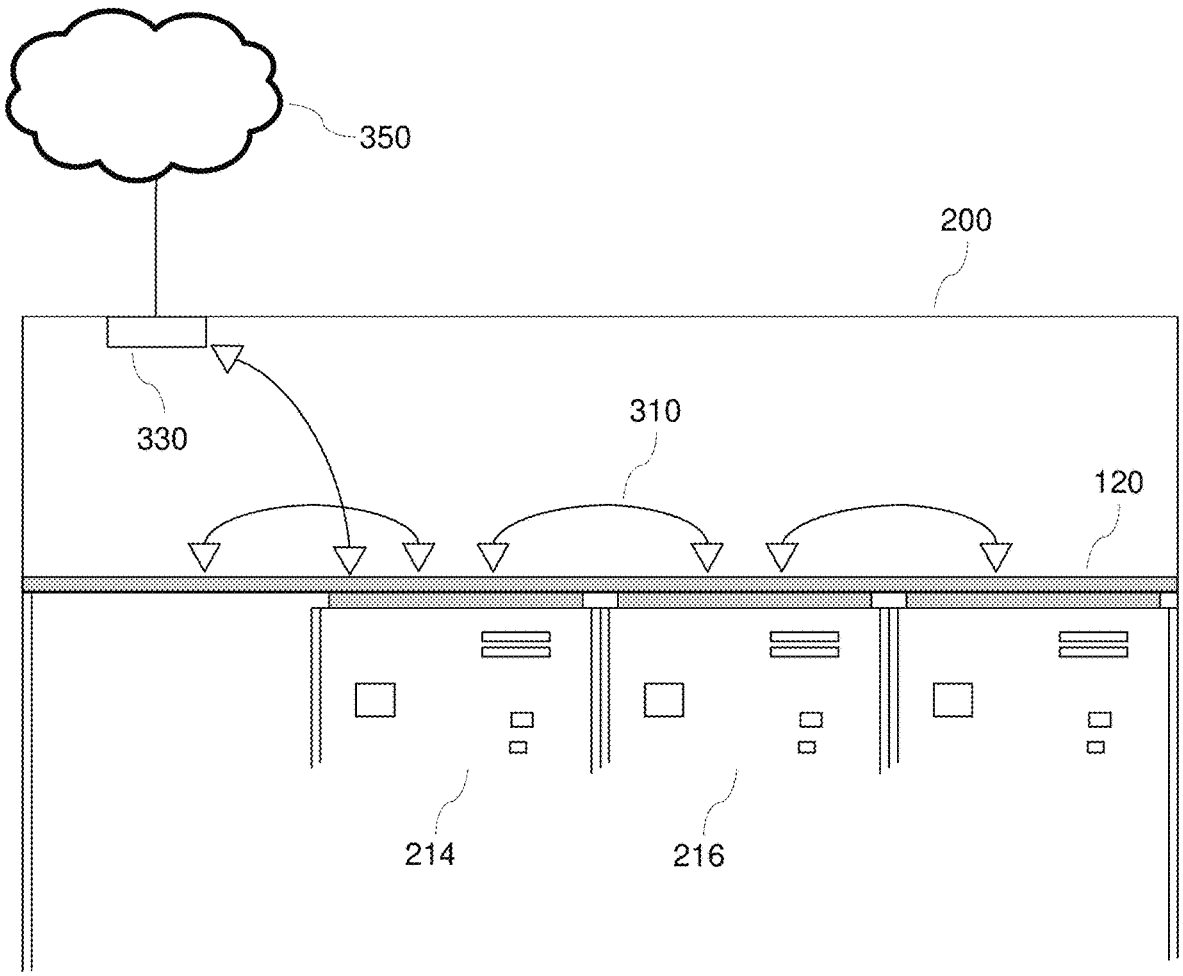
FIG. 3 depicts modules in a chassis that communicate with each other and with an external network over a network interface.

FIG. 3 shows a common modular chassis 300 that contains network interface 330 to communicate with an external network 350, e.g., the cloud. A person of skill in the art will understand that network interface 330 itself may also be implemented in a modular fashion.

In operation, at some point, virtually all data traffic must traverse backplane 120 (or other device) in order to communicate with other entities, even when data is passed only between adjacent modules. For example, modules 214 and 216 communicate with each other over communication path 310, i.e., via backplane 120. In practice, data traveling back and forth on backplane 120 introduces a greater latency than if adjacent modules could directly communicate with each other, e.g., over a common interface.

Therefore, various embodiments presented herein allow modular devices, such as modules in chassis to directly communicate with each other without additional cabling, without having to open the chassis to make a connection, and without having to communicate with each other over a single backplane as in existing architectures.

Figure 4A:
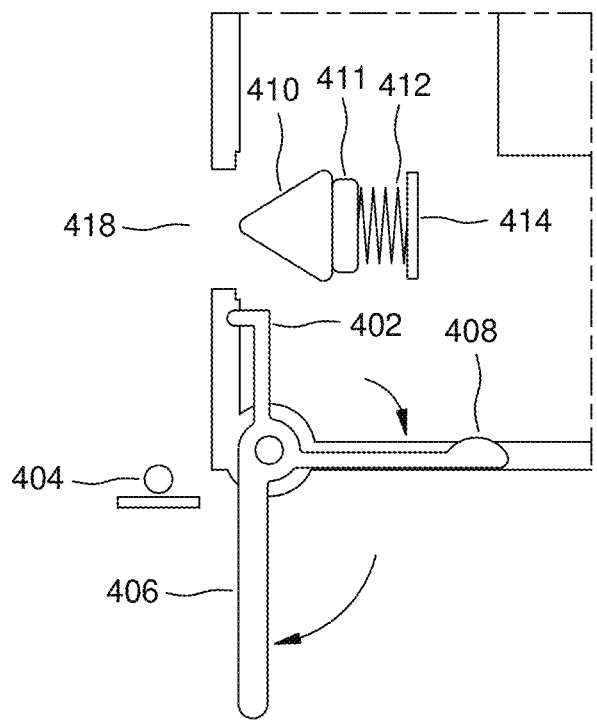
FIG. 4A and FIG. 4B depict an exemplary coupling mechanism for establishing a communication between modules, according to embodiments of the present disclosure.
Figure 4B:
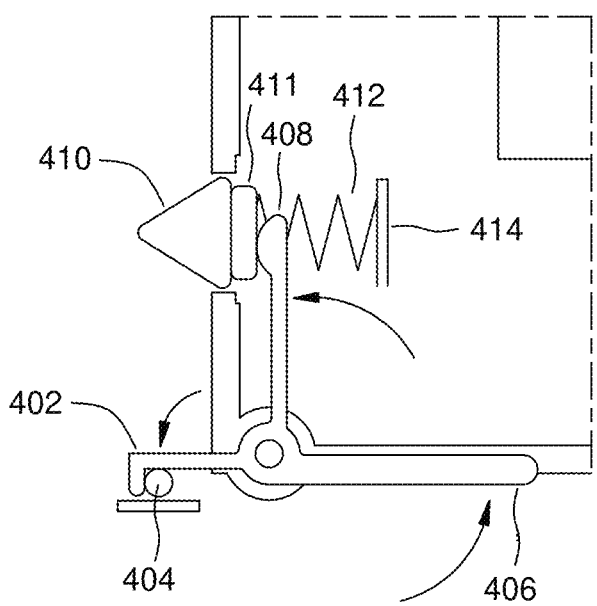

FIG. 4A and FIG. 4B illustrate an exemplary coupling mechanism for establishing a communication between modules, according to embodiments of the present disclosure. FIG. 4A comprises wedge 410, plate 411, spring 412, spring holder 414, and a latch assembly that may comprise lock latch 402, connector engaging arm 408, insertion/removal lever 406, and lock post 404 that limits the motion of lock latch 402. Although not shown in FIG. 4A, wedge 410, which represents any type of housing, may comprise one or more connectors, i.e., any type of electrical, optical, electro-optical, or other connector, such as copper, fiberoptic, or silicon photonic connector to enable a fiberoptic connection between two fiberoptic cables, a silicon wave guide connection between silicon wave guide couplers, and the like. As depicted in FIG. 4A spring 412 is in a resting position.

In operation, in embodiments, as indicated by the arrows in FIG. 4B, once pivotable lever 406 is rotated, here, in a counter-clockwise direction around a pivot axis, e.g., by manual operation or by an actuator assembly (not shown), connector engaging arm 408 may exert force on wedge 410 such as to move plate 411 and, thus, wedge 410 outward of opening 418, thereby, stretching spring 412. In embodiments, pushing wedge 410 in direction of an adjacent module (not shown) may allow one or more connectors in wedge 410 to mate with one or more connectors located in an adjacent module (not shown) located near wedge 410.

In embodiments, a locking mechanism may, in response to lock latch 402 engaging with lock post 404, advantageously, further establish a desired communicative connection, e.g., at the same time that lever 406 is being releasably locked in place by lock post 404.

It is understood that lever 406 may be rotated in any suitable direction to enable wedge 410 to move in a desired direction to make a communicative connection. It is further understood that similar or different mechanisms—whether locking or non-locking—may be employed to create a removable mechanical/and or electrical connection between wedge 410 and an adjacent module. For example, as a person of skill in the art will appreciate, in embodiments, wedge 410 may be spring-loaded, i.e., spring 412 may be compressed, when wedge 410 is engaged to facilitate a suitable mechanical/electrical contact between wedge 410 and a counterpart component. Conversely, spring 412 may be decompressed when wedge 410 is in a resting position. In addition, any type of actuator known in the art, e.g., a software-controlled actuator may be used to facilitate the rotation or motion, e.g., a suitable linear motion, or any combination thereof that may be enabled by any motion translation mechanism known in the art, e.g., to ensure the reliability, repeatability, and safety of the resulting connection.

Figure 5:
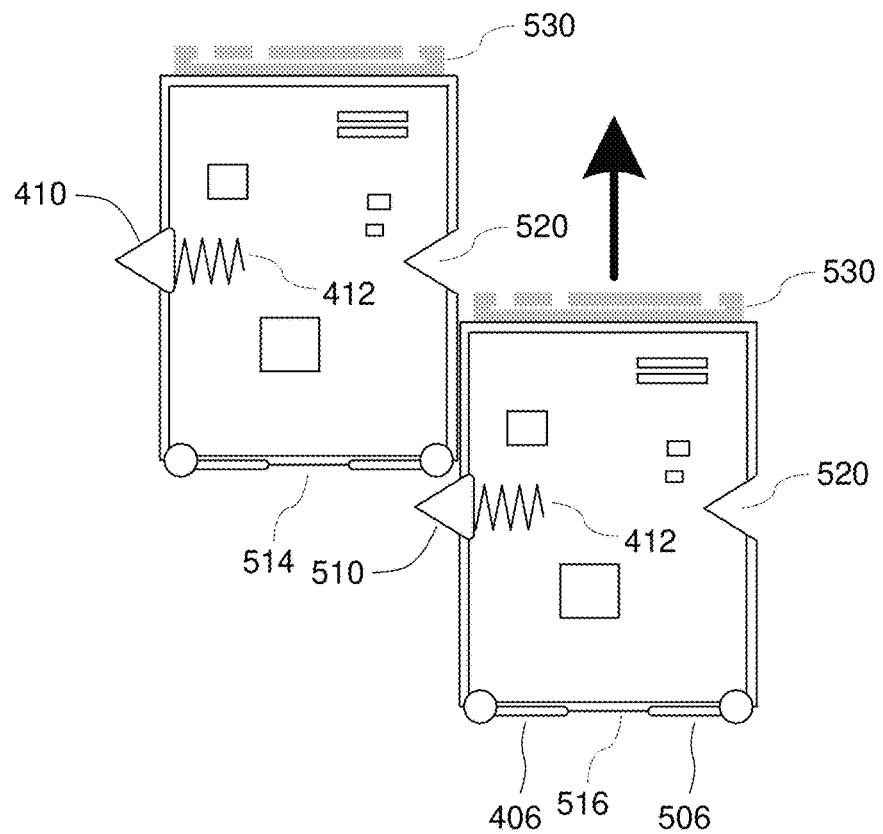
FIG. 5 depicts exemplary modules comprising a coupling mechanism for establishing a communication between modules according to embodiments of the present disclosure.

FIG. 5 illustrates exemplary modules comprising a coupling mechanism for establishing a communication between modules according to embodiments of the present disclosure. In embodiments, module 516 in FIG. 5 comprises opposing levers 406, 506, wedge 510, and module 514 comprises receptacle 520 designed to accept wedge 510. In embodiments, an assembly comprising wedge 510 and spring 412 allows wedge 510 to withdraw into module 516, e.g., until wedge 510 reaches receptacle 520 on module 514, at which point spring-loaded wedge 510 injects itself into receptacle 520, thereby, enabling a connection between a connector in wedge 510 and a complimentary connector in receptacle 520.

As an example, assuming that module 514 is stationary, module 516 may be coupled to module 514 by moving module 516 next module 514, e.g., by sliding module 516 next to module 514 along a common axis to position wedge 510 near receptacle 520, e.g., until wedge 510 and receptacle 520 are aligned, such as to allow wedge 510 to slide into receptacle 520 as guided by the complimentary shapes of both wedge 510 and receptacle 520. In embodiments, wedge 510 and receptacle 520 may be shaped in a manner such that wedge 510, acting like a guide, may slide in and out of receptacle 520. In effect, this allows any number of modules (e.g., 514 and 516) to effortlessly mate (e.g., in adjacent slots to establish a connectivity between the adjacent devices as well as a backplane connectivity via interface 530) at otherwise inaccessible locations and without the need for additional tools.

In embodiments, in line with the lever action described above with reference to FIG. 4A and FIG. 4B, levers 406, 506 in FIG. 5 may perform a dual function of locking module 516 in place and establish an communicative connection between module 514 and module 516. For example, an electrical connection may be established between module 514 and module 516 at the same time when lever 406 and/or lever 506 are activated, e.g., by a user. In embodiments, this may be accomplished by using a mechanical assembly (not shown) that uses an action of or one or more insertion/removal levers (e.g., 406) to also enable the electrical connection, e.g., by ensuring a proper seating of one or more connections of a direct bus that couples modules 514 and 516. It is understood any devices herein may comprise differing components and vary in performance and functionality, size, and shape.

Figure 6:
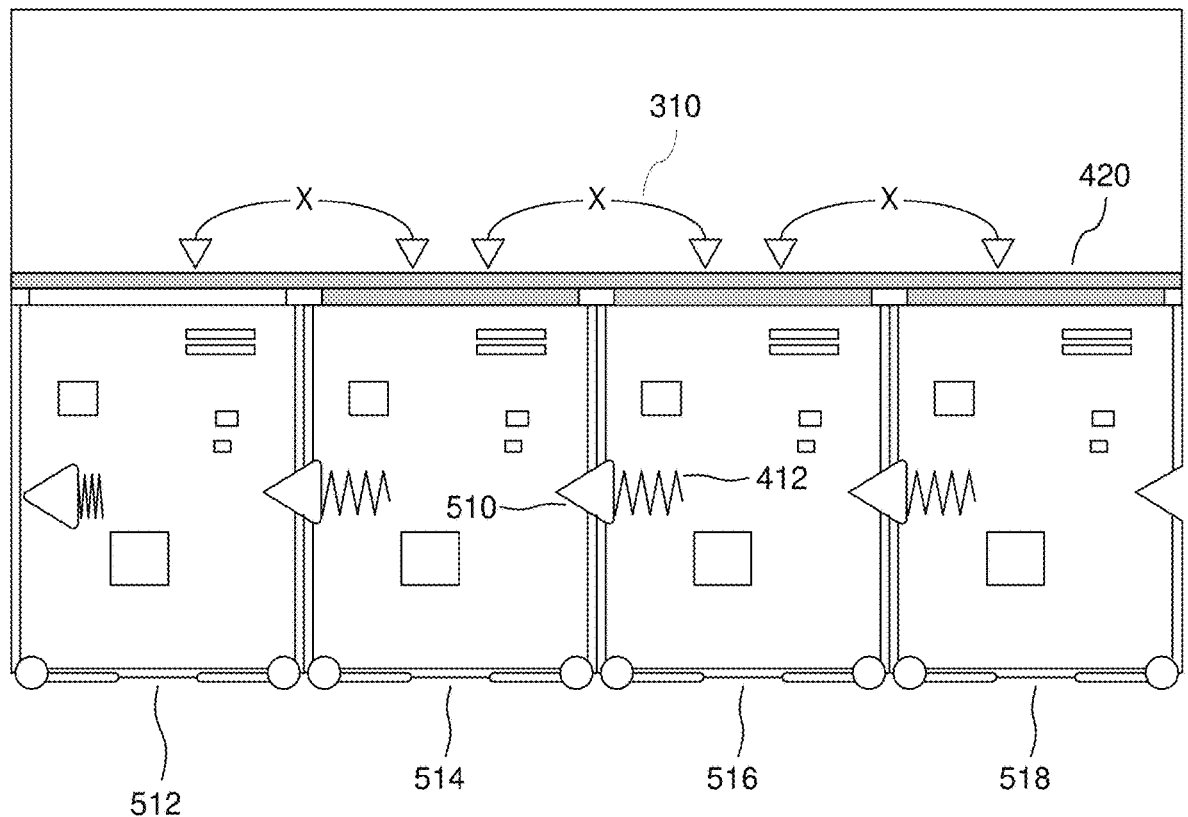
FIG. 6 depicts a modular system comprising four exemplary modules that comprise coupling mechanisms according to embodiments of the present disclosure.

FIG. 6 illustrates a modular system comprising four exemplary modules that comprise coupling mechanisms according to embodiments of the present disclosure. Modular system 600 may comprise a chassis, cage, or any other enclosure that may comprise wedge 510, spring 412, backplane connection 420, and modules 512-518. In embodiments, modular system 600 may accept any type and combination of devices, components, or modules 512-518, e.g., network servers, network switches, or storage devices. In data center type implementations, system 600 may allow users to customize a data center.

In embodiments, wedge 510 may be used to mate two adjacent modular devices (e.g., modules 514, 516) by establishing a direct bus connection. In this manner, data may directly pass between modular devices without the need for connectivity path 310 involving backplane 420, while still allowing for primary backplane connection 420. Advantageously, by enabling module 514 and module 516 to communicate directly over a shared link, bandwidth and dedicated ports (e.g., switch ports) on backplane 420 may be freed, thus, alleviating traffic flowing on backplane connection 420, i.e., increasing the bandwidth available to backplane connection 420 and allowing better control of data traffic. In addition, communication latency may be reduced as information, such as control signals, need not travel across multiple interfaces involving common backplane 420.

It is noted that although only a single direct connection between module 514 and module 516 is shown in FIG. 6, any number and type of connections may be implemented in this or a similar matter at various locations on a module. Further, unlike existing designs that are limited to communicating over a common backplane, module 514 and module 516 may communicate on different paths over different busses and in different directions, in addition to common backplane 420. Furthermore, embodiments allow module 514 and module 516 to communicate with each other and other devices in chassis 600, even if one of a number of paths/interfaces becomes temporarily congested or permanently unavailable for data traffic. Advantageously, this allows for link failover and load balancing techniques to be applied.

It is understood that although not shown, system 600 may comprise printed circuit board elements, additional communication or processing elements, etc., and may use any communication or management protocol known in the art.

Figure 7:
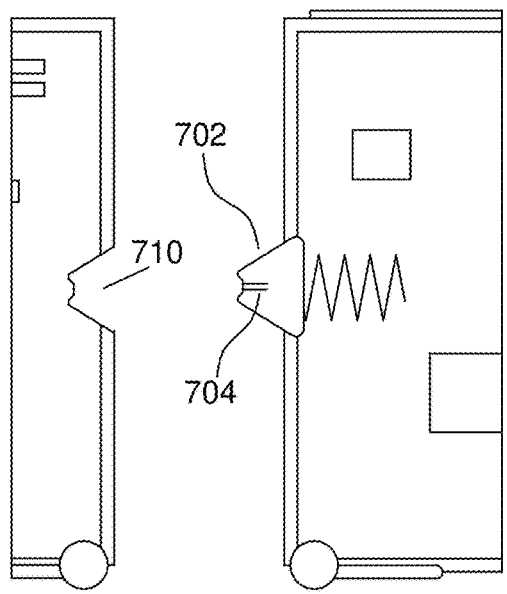
FIG. 7, FIG. 8A, and FIG. 8B depict alternative coupling mechanisms for establishing a communication between two modules, according to embodiments of the present disclosure.

FIG. 7 depicts an alternative coupling mechanism for establishing a communication between two modules, according to embodiments of the present disclosure. In embodiments, coupling mechanism 700 comprises connector assembly 702, connector(s) 704, and receptacle 710. Connector 704 may comprise silicon photonic or fiberoptic waveguides or copper connections designed to couple to receptacle 710.

As depicted in FIG. 7, connector assembly 702 may comprise a concave portion or an indented tip that extends beyond the edge of connector 704. Receptacle 710 may have a convex or outward connection. In embodiments, the concave portion of concave portion may protect connector 704, e.g., from physical impact and potential damage when connector 704 is inserted into receptacle 710 to mate with receptacle 710.

It is understood that similar or different mechanisms may be used to facilitate removable connections between adjacent modules, e.g., to allow for ease of installation. For example, connector assembly 702 may be implemented using other shapes, e.g., those illustrated in FIG. 8A and FIG. 8B, which depict alternative coupling mechanisms for establishing a communication between two modules according to embodiments of the present disclosure. Connector assembly 802 in FIG. 8A has a shape that resembles a half circle. In embodiments, such shape may advantageously reduce friction when connector assembly 802 is inserted into receptacle 810. Receptacle 810 may have a complementary half-circle shape.

Figure 8B:
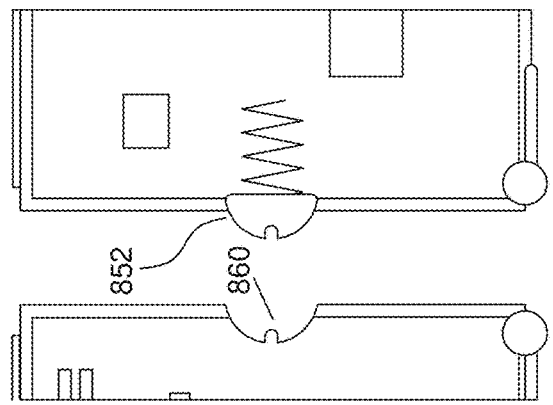
Figure 8A:
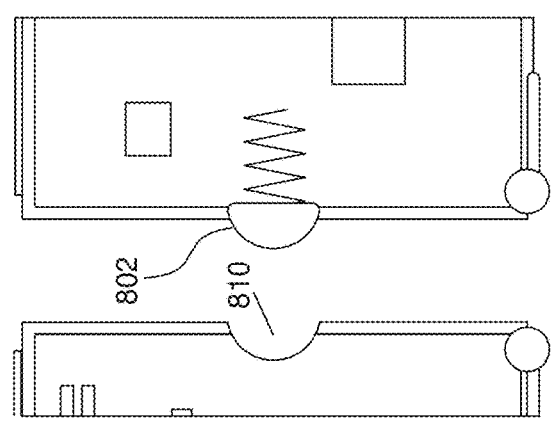

In embodiments, similar to FIG. 7, a connector assembly may comprise a concave portion or an indented tip that extends beyond the edge of connector 852, as in shown in FIG. 8B. FIG. 9A and FIG. 9B illustrate a waveguide coupling mechanism for establishing a communication between two modules according to embodiments of the present disclosure. The coupling mechanism may comprise connector 902, connector pins or guide pins 932, waveguide 920, 934, gear assembly 936, receptacle 910, and receive pin 924. Connector 902 in FIG. 9A may be implemented as a waveguide coupler. Gear assembly 936 may be controlled by a set of actuators (not shown) that may be driven by software or firmware. FIG. 10A and FIG. 10B illustrate an alternative waveguide coupling mechanism according to embodiments of the present disclosure. Components similar to FIG. 9A and FIG. 9B are labeled in a similar manner. As depicted in FIG. 10A and FIG. 10B, connector 902 may have a flat interface to make a flush connection with receptacle 1010.

FIG. 11 depicts a flowchart for an exemplary process for establishing a communication between modular devices according to embodiments of the present disclosure. In embodiments, process 1100 for coupling modular electronic devices may begin when, in response to a first module, which comprises a connector assembly, being moved along an enclosure of a second module, the connector assembly may be caused to at least partially retract (1105) inwardly into the first module. The connector assembly may comprise a connector and a connector mating interface. The enclosure of the second module may comprise a receptacle assembly that may comprise a receptacle and a receptacle mating interface.

In response to the connector assembly at least partially aligning with the receptacle assembly, the connector assembly maybe caused to move (1110) into the receptacle assembly.

Finally, in response to the connector assembly moving into the receptacle assembly, a releasable connection may be established (1115) between the connector mating interface and a receptacle mating interface, e.g., along a mating axis.

Figure 12:
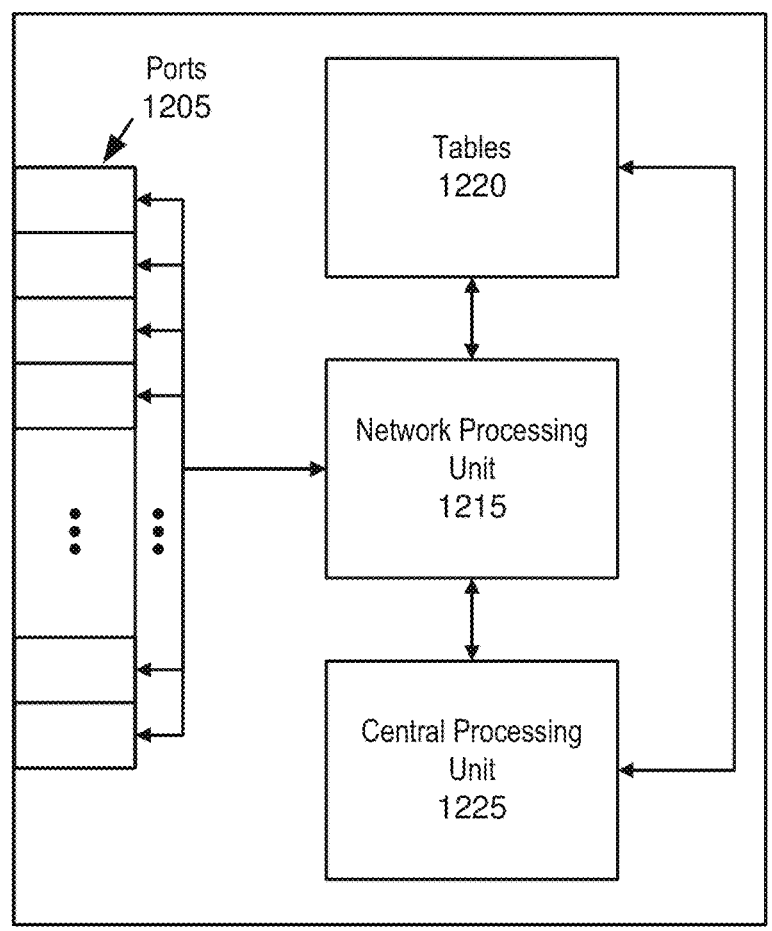
FIG. 12 depicts a block diagram of an information handling system, according to embodiments of the present disclosure.

FIG. 12 depicts a block diagram of an information handling system, according to embodiments of the present disclosure. It will be understood that the functionalities shown for system 1200 may operate to support various embodiments of the present disclosure—although it shall be understood that such system may be differently configured and include different components, additional components, or fewer components.

The information handling system 1200 may include a plurality of I/O ports 1205, a network processing unit (NPU) 1215, one or more tables 1220, and a central processing unit (CPU) 1225. The system includes a power supply (not shown) and may also include other components, which are not shown for sake of simplicity.

In one or more embodiments, the I/O ports 1205 may be connected via one or more cables to one or more other network devices or clients. The network processing unit 1215 may use information included in the network data received at the node 1200, as well as information stored in the tables 1220, to identify a next device for the network data, among other possible activities. In one or more embodiments, a switching fabric may then schedule the network data for propagation through the node to an egress port for transmission to the next destination.

One skilled in the art will recognize no computing system or programming language is critical to the practice of the present disclosure. One skilled in the art will also recognize that a number of the elements described above may be physically and/or functionally separated into modules and/or sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A connector assembly for coupling modular electronic devices, the connector assembly comprising:
    a connector comprising a connector mating interface, the connector being implemented in a first modular device;
    a housing to hold the connector;
    a spring coupled to the housing; and
    a spring holder to hold the spring, the connector configured to mate with a receptacle mating interface to establish a releasable connection along a mating axis when the housing is moved into a receptacle assembly of a second modular device that comprises the receptacle assembly.

2. The connector assembly of claim 1, wherein the housing at least partially retracts inwardly into the first modular device when being moved along an enclosure of the second modular device.

3. The connector assembly of claim 2, wherein the housing is moved into the receptacle assembly in response to the spring pushing the housing outwardly away from the first modular device along the mating axis that is perpendicular or substantially perpendicular to the enclosure.

4. The connector assembly of claim 1, further comprising an engaging arm to move the housing outwardly away from the first modular device.

5. The connector assembly of claim 4, further comprising an actuator that causes the engaging arm to pivot around a pivot axis to move the housing, the housing comprising a concave surface.

6. The connector assembly of claim 4, further comprising a lock post and both a lever and a lock latch coupled to the engaging arm, the lock latch engages with the lock post to releasably lock the first modular device in place in response to the lever being operated which causes the engaging arm to pivot around a pivot axis such as to move the housing into the receptacle assembly to establish the releasable connection.

7. The connector assembly of claim 1, wherein the connector is at least one of a silicon photonic connector, an optical waveguide, or an electro-optical connector.

8. A method for establishing a communication between modular electronic devices, the method comprising:
    in response to a first module that comprises a connector assembly being moved along an enclosure of a second module, causing the connector assembly to at least partially retract inwardly into the first module, the enclosure comprising a receptacle assembly, the connector assembly comprising a connector and a connector mating interface, the receptacle assembly comprising a receptacle and a receptacle mating interface;

in response to the connector assembly at least partially aligning with the receptacle assembly, causing the connector assembly to move into the receptacle assembly; and in response to the connector assembly moving into the receptacle assembly, establishing a releasable connection between the connector mating interface and a receptacle mating interface along a mating axis.

9. The method of claim 8, wherein the connector assembly comprises at least one of a silicon photonic connector, a fiberoptic waveguide, or a copper connection.

10. The method of claim 8, wherein at least one of the connector assembly or the receptacle assembly comprises a concave surface.

11. The method of claim 8, wherein the connector mating interface and the receptacle mating interface are flush.

12. The method of claim 8, wherein the connector assembly is coupled to a spring that pushes the connector assembly outwardly away from the first module along the mating axis, the mating axis being perpendicular or substantially perpendicular to the enclosure.

13. The method of claim 8, wherein the step of causing the connector assembly to move into the receptacle assembly is performed by an actuator located in the first module.

14. The method of claim 13, wherein the actuator causes an engaging arm to push the connector assembly outwardly away from the first module.

15. The method of claim 8, wherein the connector assembly comprises a guide pin and the receptacle assembly comprises a receive pin that is designed to mate with the guide pin.

16. A modular system comprising:
a first modular device comprising:
 a connector that comprises a connector mating interface;
 a housing to hold the connector;
 a spring coupled to the housing; and
 a spring holder to hold the spring; and
a second modular device comprising a receptacle assembly comprising a receptacle that comprises a receptacle mating interface, the connector configured to mate with the receptacle mating interface to establish a releasable connection along a mating axis when the housing is moved into the receptacle assembly.

17. The modular system of claim 16, wherein the housing at least partially retracts inwardly into the first modular device when being moved along an enclosure of the second modular device.

18. The modular system of claim 17, wherein the housing is moved into the receptacle assembly in response to the spring pushing the housing outwardly away from the first modular device along the mating axis that is perpendicular or substantially perpendicular to the enclosure.

19. The modular system of claim 16, further comprising further comprising an engaging arm to move the housing outwardly away from the first modular device.

20. The modular system of claim 19, further comprising a lock post and both a lever and a lock latch coupled to the engaging arm, the lock latch engages with the lock post to releasably lock the first modular device in place in response to the lever being operated which causes the engaging arm to pivot around a pivot axis such as to move the housing into the receptacle assembly to establish the releasable connection.

* * * * *